United States Patent [19]
Kim et al.

[11] Patent Number: 6,156,668
[45] Date of Patent: Dec. 5, 2000

[54] METHOD FOR FORMING A FINE PATTERN IN A SEMICONDUCTOR DEVICE

[75] Inventors: Hyung Gi Kim; Myung Soo Kim; Cheol Kyu Bok; Ki Ho Baik; Dae Hoon Lee; Jin Woong Kim; Byung Jun Park, all of Kyoungki-do, Rep. of Korea

[73] Assignee: Hyundai Electronics Industries Co., Ltd., Kyoungki-Do, Rep. of Korea

[21] Appl. No.: 09/294,874

[22] Filed: Apr. 20, 1999

[30] Foreign Application Priority Data

Aug. 20, 1998 [KR] Rep. of Korea ............... 98-33831

[51] Int. Cl.⁷ ............................................. H01L 21/00
[52] U.S. Cl. ..................... 438/725; 134/1.2; 216/62; 438/705; 438/734
[58] Field of Search ........................ 438/705, 710, 438/725, 723, 734, 743; 216/49, 62, 67; 134/1.2, 1.3

[56] References Cited

U.S. PATENT DOCUMENTS

| | | |
|---|---|---|
| 5,356,478 | 10/1994 | Chen et al. .................. 134/1 |
| 5,382,316 | 1/1995 | Hills et al. .................. 156/643 |
| 5,525,192 | 6/1996 | Lee et al. ..................... 438/725 X |
| 6,001,739 | 12/1999 | Konishi ........................ 438/725 X |

*Primary Examiner*—William Powell
*Attorney, Agent, or Firm*—Nath & Associates; Gary M. Nath; Harold L. Novick

[57] ABSTRACT

A method for forming a fine pattern in a semiconductor device removes roughness from a pattern produced in a fine pattern fabrication process using a silylation process as being one kind of a TSI process, eliminates smoothly a photosensitive film residue caused by a residue silylation layer remained on a-non-pattern area, and increases a margin of a lithography process. To achieve the foregoing, the method performs an etching process with a fluorine/oxygen mixture gas so as to remove a thin oxide film being formed on the non-pattern area after a silylation process, enables an edge portion of a silylation region to be planarized so as to prevent the pattern from becoming rough, and forms a photosensitive film pattern by developing the photosensitive film with oxygen plasma. Thereafter, the photosensitive film residue is etched again with a mixture gas of fluorine/oxygen, thereby increasing a fabrication margin of the fine pattern.

10 Claims, 11 Drawing Sheets

METHOD FOR FORMING A FINE PATTERN IN A SEMICONDUCTOR DEVICE

BACKGROUND OF THE INVENTION

1. Field of the Invention

The present invention relates to a fabrication process of a fine pattern in a semiconductor device. More particularly, it relates to a method for forming a fine pattern in a semiconductor device which performs three etching steps after the silylation process in a fabrication process of a fine pattern of a top surface imaging (hereinafter referred to as a TSI) process thereby preventing the pattern from becoming rough occurs by either leaving photosensitive film residue on a non-pattern area or an irregular breaking of a silylation layer's edge portion, and thereby increasing the margin in the lithography process.

2. Description of the Prior Art

In recent times, following the current trend of requiring high-integration semiconductor device, a technology for forming a fine pattern has been developed.

Specifically, a photosensitive film pattern formed by a photolithography process has been widely used as a mask of etching or ion implantation in a fabrication process of a semiconductor device.

Accordingly, a fineness of the photosensitive film pattern, a stability of a fabrication process, a clear elimination after finishing the fabrication process, and a facilitation of a reworking operation that removes wrong photosensitive film pattern and then reforms a photosensitive film pattern, largely, affect a production yield and a reliability of the semiconductor device.

In the light of the foregoing, a conventional art will now be described with reference to FIGS. 1–7.

FIGS. 1–4 depict a process for forming a fine pattern in a semiconductor device according to the conventional art, and specifically depict an example of TSI process wherein a light-exposure area is patterned.

Referring to FIG. 1, an etched layer 12 and a photosensitive film 14 for silylation are sequentially formed on a semiconductor substrate 10, and then, a selective light-exposure process using a light-exposure mask 16 is performed.

Thereafter, a presilylation bake process is performed about the photosensitive film 14, and a silylation process that implants a silicon into a light-exposure area by using silylation materials such as a tetramethyldisilazane (hereinafter referred to as TMDS) and a hexamethyldisilazane (hereinafter referred to as HMDS) is then performed.

At this time, as shown in FIG. 2, nitrogen(N)—silicon(Si) coupling inside of a silylation material reacts with oxygen (O)—hydrogen(H) coupled inside of a photosensitive film resin, thereby forming O—Si coupling and a silylation region 18. Also, some silylations occur in a non-exposure area.

After that, in order to eliminate a photosensitive film residue, a first etching step performs an etching process about both the light-exposure area and the non-exposure area by using a mixed gas of fluorine(F)-based gas and oxygen(O) gas, and removes a silylation region 18 formed on the non-exposure area.

Then, as shown in FIG. 3, a second etching step uses an oxide film layer (not shown) as an etching boundary, and forms a photosensitive film 14's pattern by a dry type etching method using the oxygen gas. Herein, the oxide film is formed by coupling a silylation region 18 formed on the light-exposure area and the oxygen. In this case, a roughness remains on a side wall 14a of the photosensitive film 14's pattern.

As shown in FIG. 4, if the etched layer 12 that is being exposed by the use of the photosensitive film 14's pattern as a mask is etched until the semiconductor substrate 10 are exposed, the etched layer 12's pattern is formed. At this time, a side wall 12a of the etched layer 12 becomes rough.

The above method for forming a fine pattern in a semiconductor device according to the conventional art has the following disadvantages.

If the first etching step performs an etching process without using the fluorine-based gas in etching the photosensitive film pattern, the photosensitive film residue is left after the second etching step as shown in FIGS. 6–7.

Also, if the first etching step uses the fluorine-based gas in order to remove the photosensitive film residue, an edge portion of a silylation region formed on the light-exposure area are irregularly broken at the same time that a silylation region thinly formed on the non-exposure area is removed. Therefore, as shown in FIG. 5, a side wall of the photosensitive film pattern becomes rough.

Such roughness is transcribed in etching the etched layer, an irregular pattern is thus formed. As a result, a fabrication margin is decreased, and a production yield of the semiconductor device is lowered.

SUMMARY OF THE INVENTION

Accordingly, the present invention is directed to a method for forming a fine pattern in a semiconductor device that substantially obviates one or more of the problems due to limitations and disadvantages of the related art.

It is an object of the present invention to provide a method for forming a fine pattern in a semiconductor device which prevents the side wall of a photosensitive film pattern from becoming rough. The roughness is caused by an irregular breaking of a silylation region's edge portion. Wherein a fabrication process of a fine pattern by a silylation process being one kind of a TSI process.

It is another object of the present invention to provide a method for forming a fine pattern in a semiconductor device which prevents a defective pattern caused by a residue left on a non-pattern area, increases a margin of a lithography process, and enhances a production yield of a semiconductor device.

To achieve the above objects, a method for forming a fine pattern in a semiconductor device according to the present invention includes the steps of:

(a) sequentially forming an etched layer and a photosensitive film for silylation on a semiconductor substrate;

(b) selectively exposing the photosensitive film by using a light-exposure mask;

(c) selectively forming a silylation region by performing a silylation on a surface of the photosensitive film;

(d) partially etching the surface of the photosensitive film with a fluorine-based gas or a mixed gas of fluorine/ oxygen, and removing a silylated portion on a portion determined as a non-pattern area during the silylation process in order to prevent an irregular breaking of a silylation region edge portion;

(e) partially etching the surface of the photosensitive film with a fluorine-based gas or a mixed gas of fluorine/ oxygen, and removing a silylated portion on a portion determined as a non-pattern area during the silylation process in order to prevent an irregular breaking of a silylation region edge portion;

(f) etching a photosensitive film of the non-pattern area with oxygen plasma using the silylation region of a light-exposure area as an etching boundary to form a photosensitive film pattern;

(g) etching a photosensitive film residue left on the photosensitive film pattern using a fluorine-based gas or a mixed gas of fluorine/oxygen; and (h) etching the etched layer using the photosensitive film pattern as a mask to form a pattern of the etched layer.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

FIGS. 8–12 depict a process for forming a fine pattern in a semiconductor device according to the present invention.

Referring to FIGS. 8–12, an etched layer 32 and a photosensitive film 34 for a silylation are sequentially formed on a semiconductor substrate 30, and a shallow light-exposure step is performed with a selective light-exposure method using a light-exposure mask 36.

Figure 1:
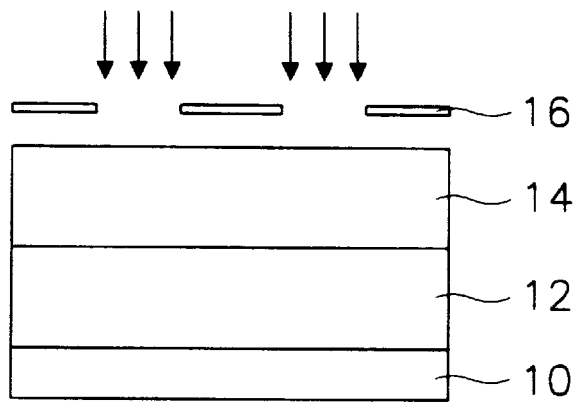
FIGS. 1–4 depict a process for forming a fine pattern in a semiconductor device according to the conventional art.
Figure 2:
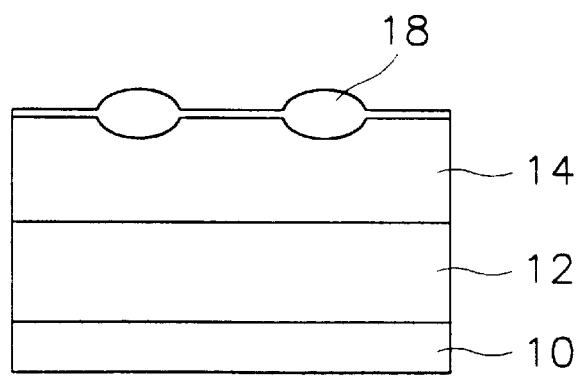
Figure 3:
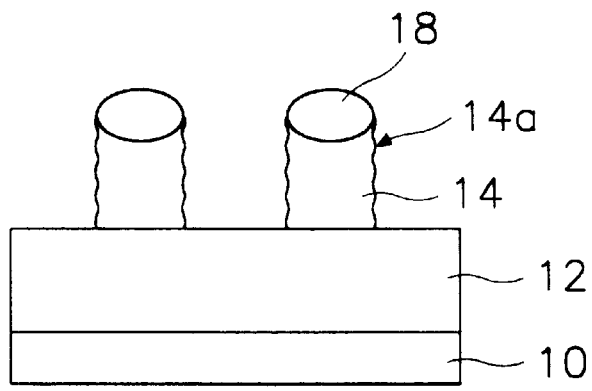
Figure 4:
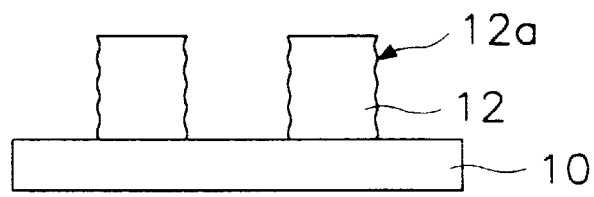
Figure 5:
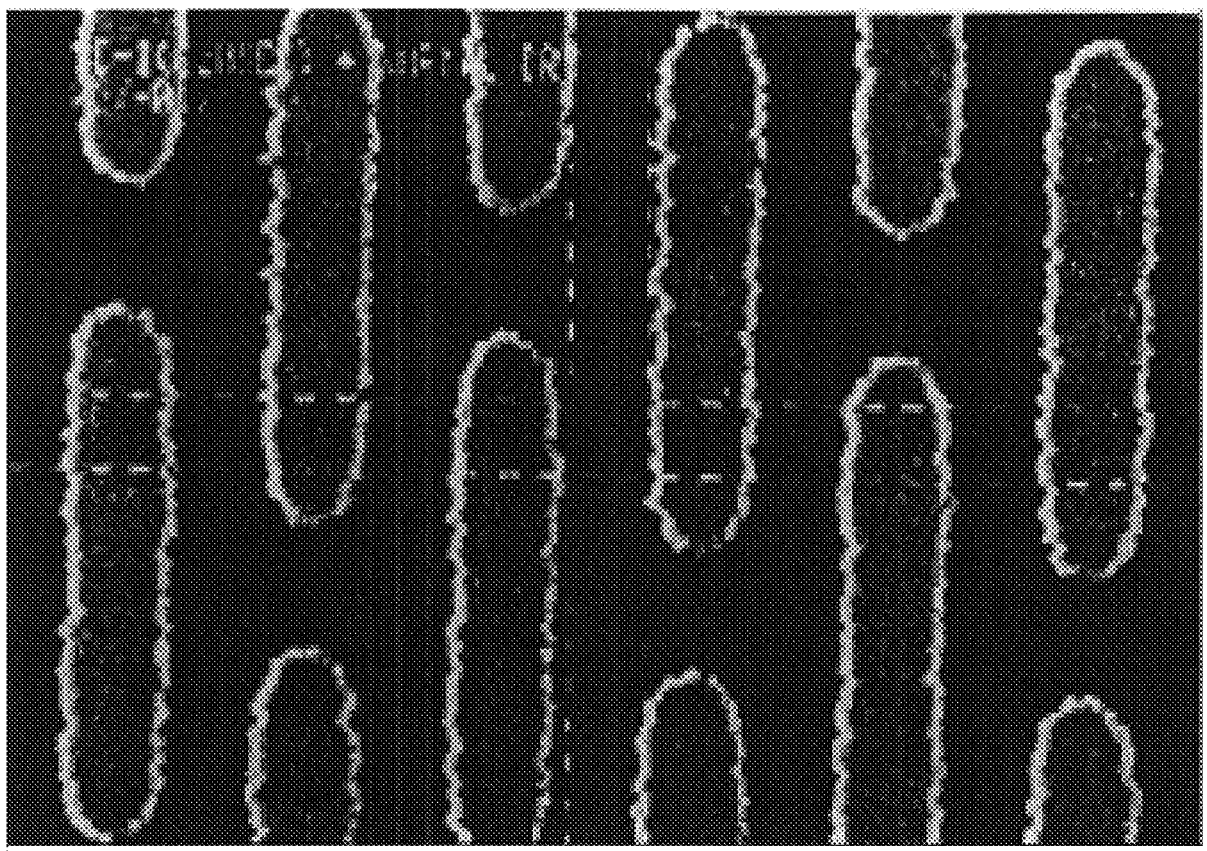
FIG. 5 is a plane view of a pattern formed by the conventional art.
Figure 6:
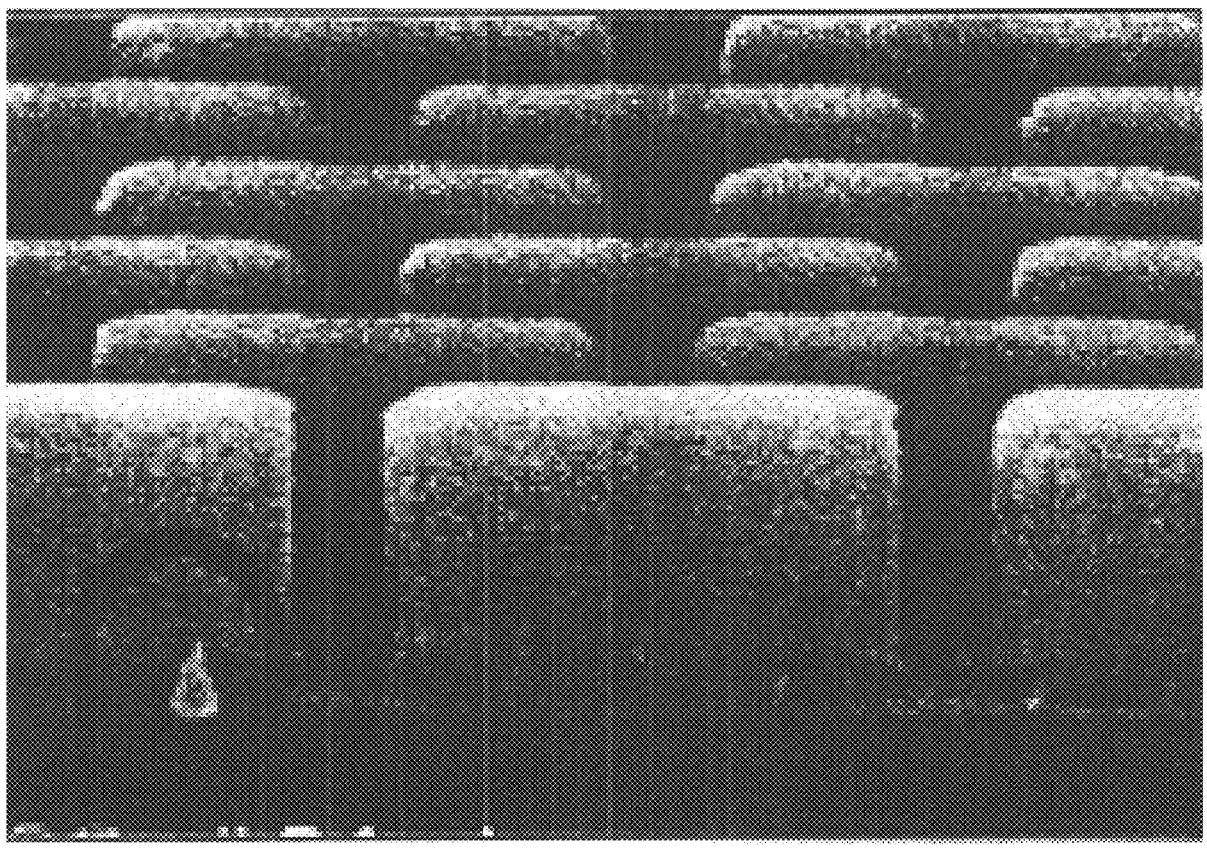
FIG. 6 is a lateral view of a pattern formed by the conventional art.
Figure 7:
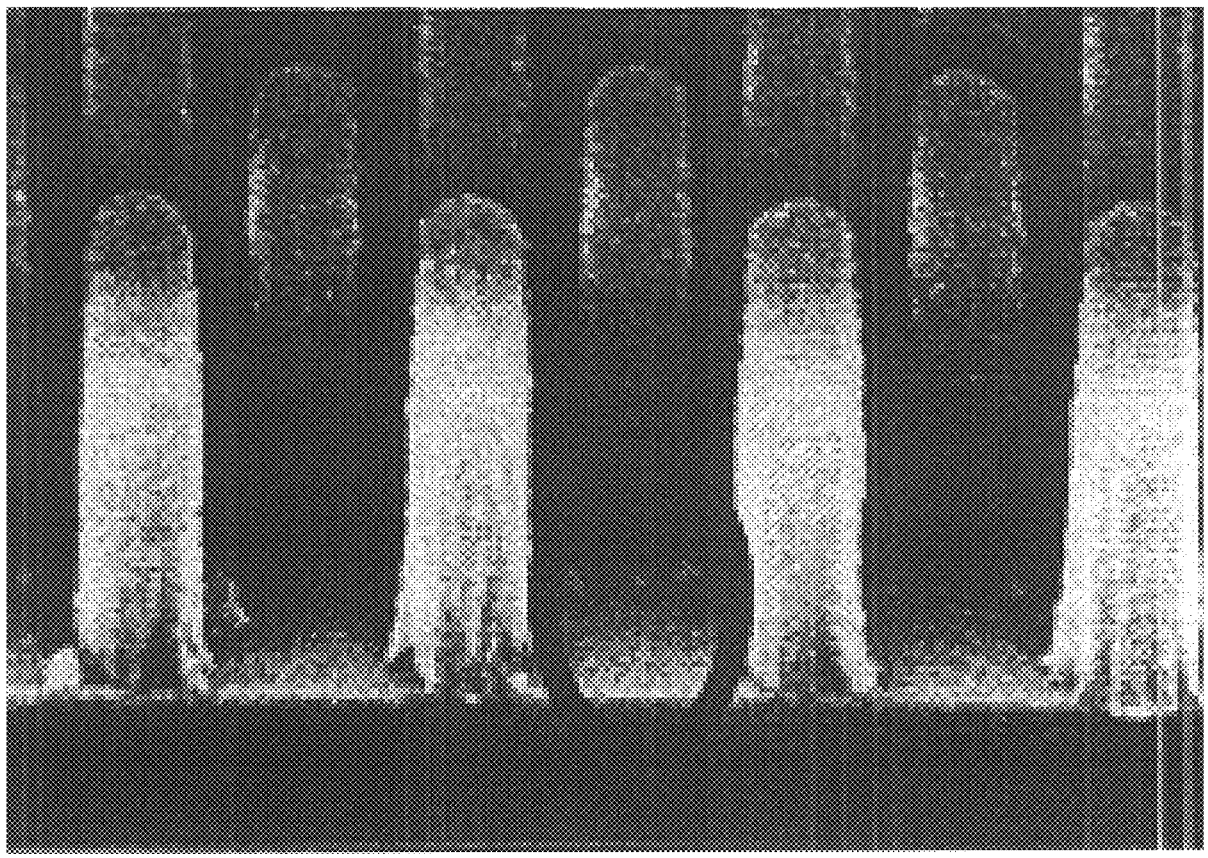
FIG. 7 is a front view of a pattern formed by the conventional art.
Figure 8:
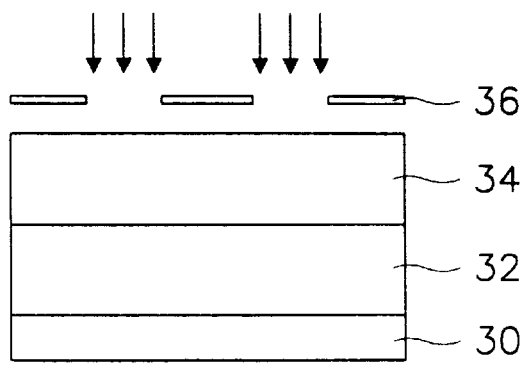
FIGS. 8–12 depict a process for forming a fine pattern in a semiconductor device according to the present invention.
Figure 9:
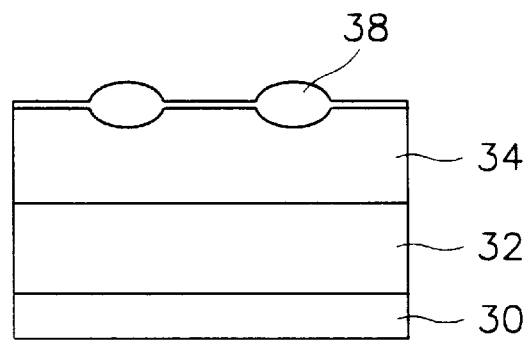

At this time, as shown in FIG. 8, the photosensitive film 34 is preferably formed at a thickness of 5000–15000 Å.

After the photosensitive film 34 is presilylation-baked at a temperature of 100–200° C. with atmosphere of helium (He) gas or $N_2$ gas, a silylation process where a silicon is implanted into a light-exposure area by using a silylation material is performed, thereby selectively forming a silylation region 38.

At this time, the silylation material is a selected one or a mixture of at least two components among the following: hexamethyldisilazane (HMDS), tetramethyldisilazane (TMDS), dimethylaminodimethylsilane, dimethylaminoethylsilane, dimethylsilydimethylamine, trimethylsilydimethylamine, trimethylsilydiethylamine, and dimethylaminopentamethylsilane.

The silylation process is performed at a temperature of 90–180° C. during 30–300 seconds wherein, Si-component inside of the silylation material reacts on OH-component of a resin inside of the photosensitive film of the light-exposure area, thereby forming SiOx. A silylation is partially generated on a non-exposure area, thereby forming a thin silylation region.

Then, a predetermined thickness of the photosensitive film 34 is etched with a mixed gas of fluorine-based gas and oxygen gas under fabrication conditions (i.e., a temperature of −10–30° C., a pressure of 1–50 mTorr, a top power of 10–300 W, a bottom power of 0–100 W, fluorine-based gas of 1–10 sccm, and oxygen gas of 0–30 sccm).

In this case, one gas among $C_2F_6$, $CF_4$, and $C_4F_8$ gases is selected as the fluorine-based gas.

In the above first etching step, if the amount of the fluorine-based gas increases and the etching time becomes longer, the edge portion of the silylation region 38 is irregularly broken, thereby increasing the roughness of the photosensitive film pattern.

However, according to the result of the present invention, under the above conditions, a roughness degree is 30 nm during the etching of 30 seconds, a roughness degree is 12.5 nm during the etching of 10 seconds, and a roughness degree is 6.0 nm during the etching of 5 seconds. The roughness degree of 6.0 nm is regarded as a negligible.

Accordingly, in order to achieve a negligible roughness degree of the pattern, the amount of the fluorine-based gas and the etching time should be reduced.

Thereafter, if a dry type etching process using a plasma is performed with either $O_2$ or a mixed gas of $O_2/He_2/SO_2$ under fabrication conditions (i.e., a temperature of −10–30° C. and a pressure of 1–50 mTorr), the photosensitive film 34 is etched by using a silicon oxide film as an etching boundary, thereby forming a pattern of the photosensitive film 34 exposing the etched layer 32. Herein, the silicon oxide film is formed on the silylation region 38 on the light-exposure area after reacting on the oxygen plasma.

At this time, since the oxygen plasma is used for forming the pattern of the photosensitive film 34, a photosensitive film residue 40 is left in small-quantities on the silylation region remained on the non-exposure area.

Figure 10:
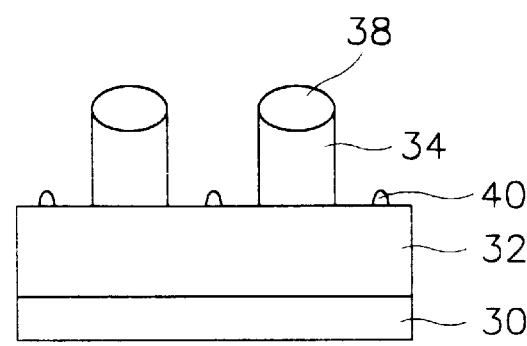
Figure 11:
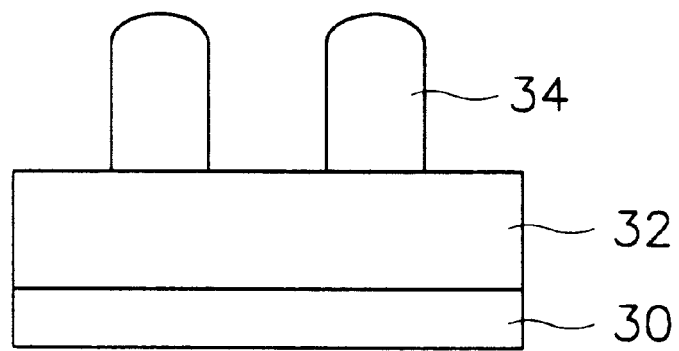

In addition, as shown in FIG. 10, since the irregular breaking of the edge portion of the silylation region is prevented, the side wall of the photosensitive film pattern does not become rough.

Thereafter, in order to eliminate the photosensitive film residue 40 on the non-exposure area, a third etching step is performed with the mixed gas of fluorine-based gas/oxygen gas under fabrication conditions (i.e., top power of 10–300 W, bottom power of 0–100 W, fluorine-based gas of 1–10 sccm, oxygen gas of 0–30 sccm, temperature of −10–30° C., and pressure of 1–50 mTorr).

By the first to third etching steps, a favorable pattern having no residue therein can be obtained as shown in FIGS. 13–16.

In this case, one fluorine-based gas is selected among $C_2F_6$, $CF_4$, and $C_4F_8$ gases.

Figure 12:
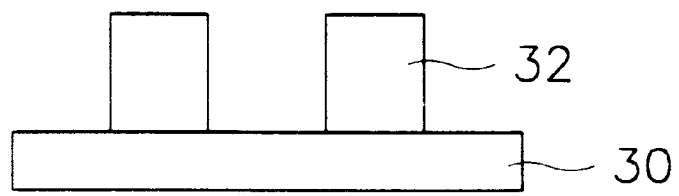
Figure 13:
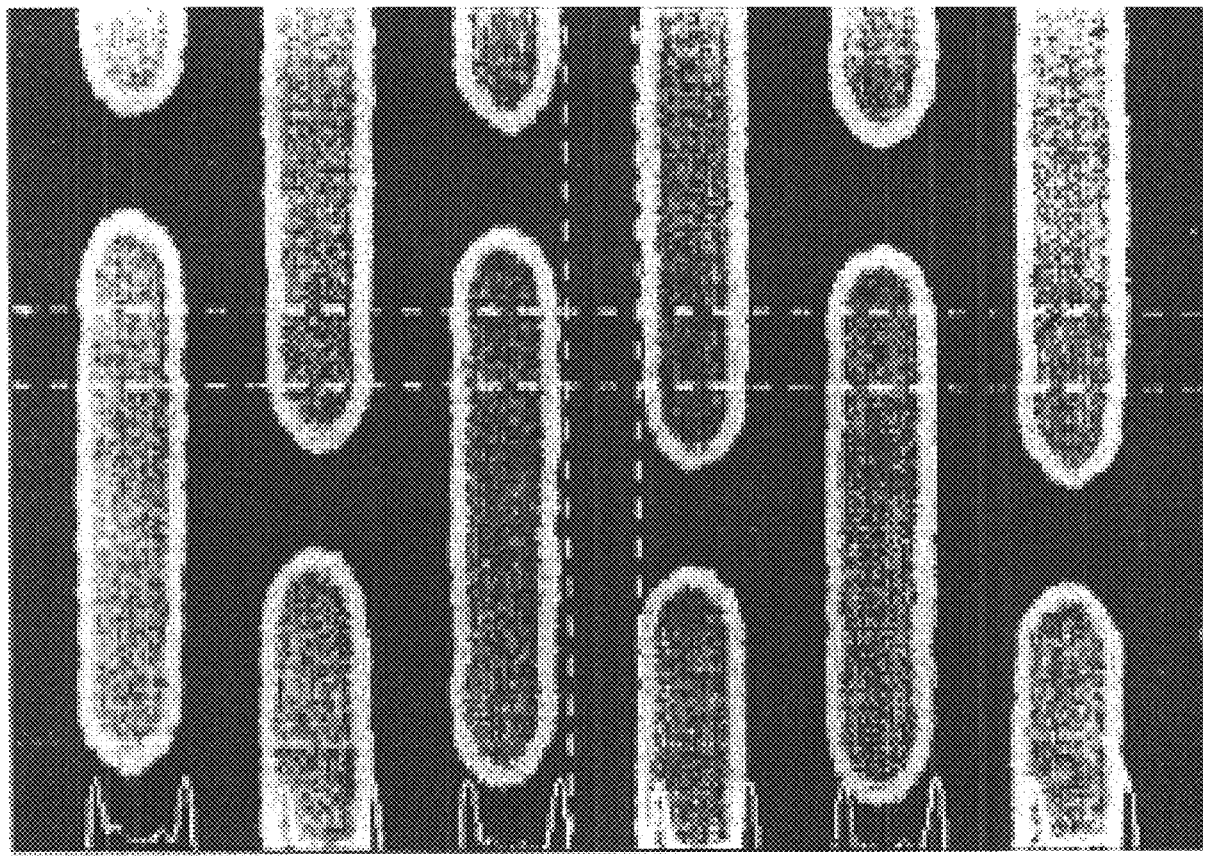
FIG. 13 is a plane view of a pattern formed by the present invention.
Figure 14:
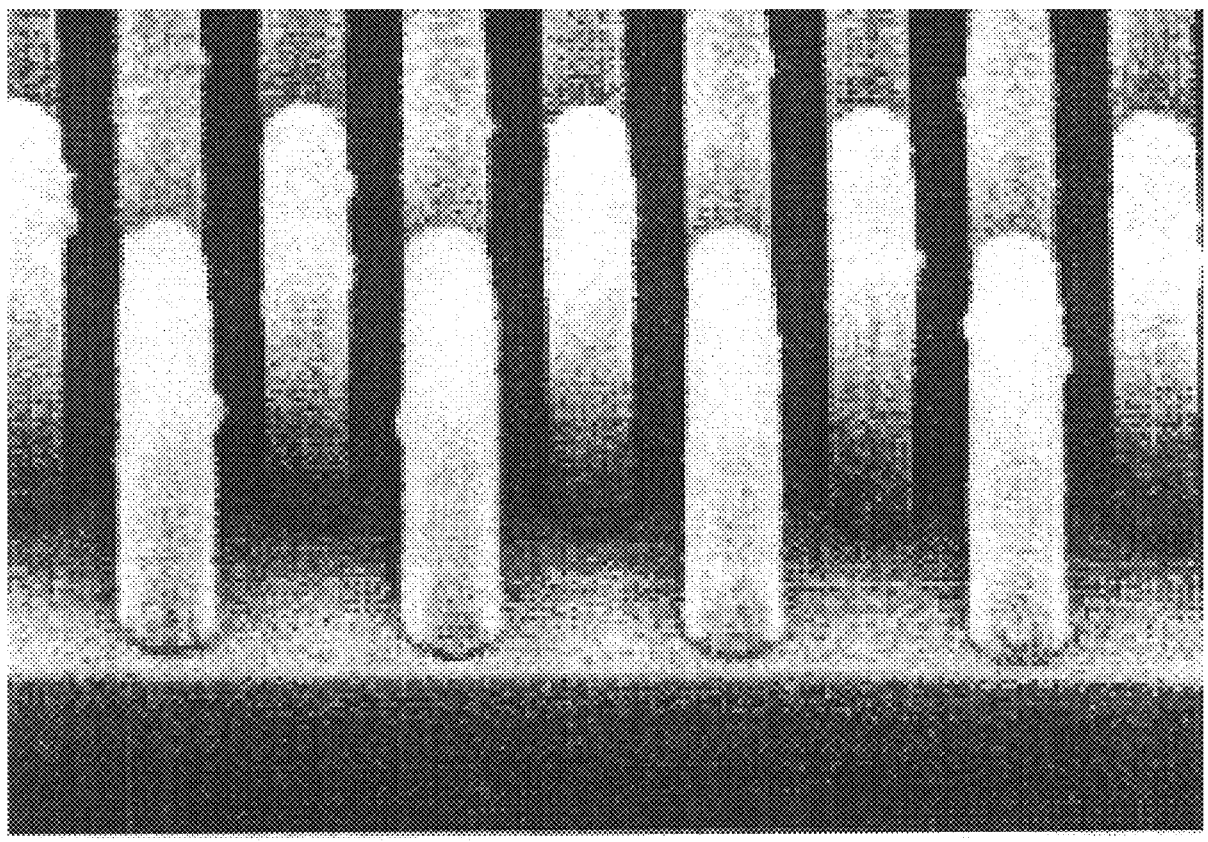
FIG. 14 is a front view of a pattern formed by the present invention.
Figure 15:
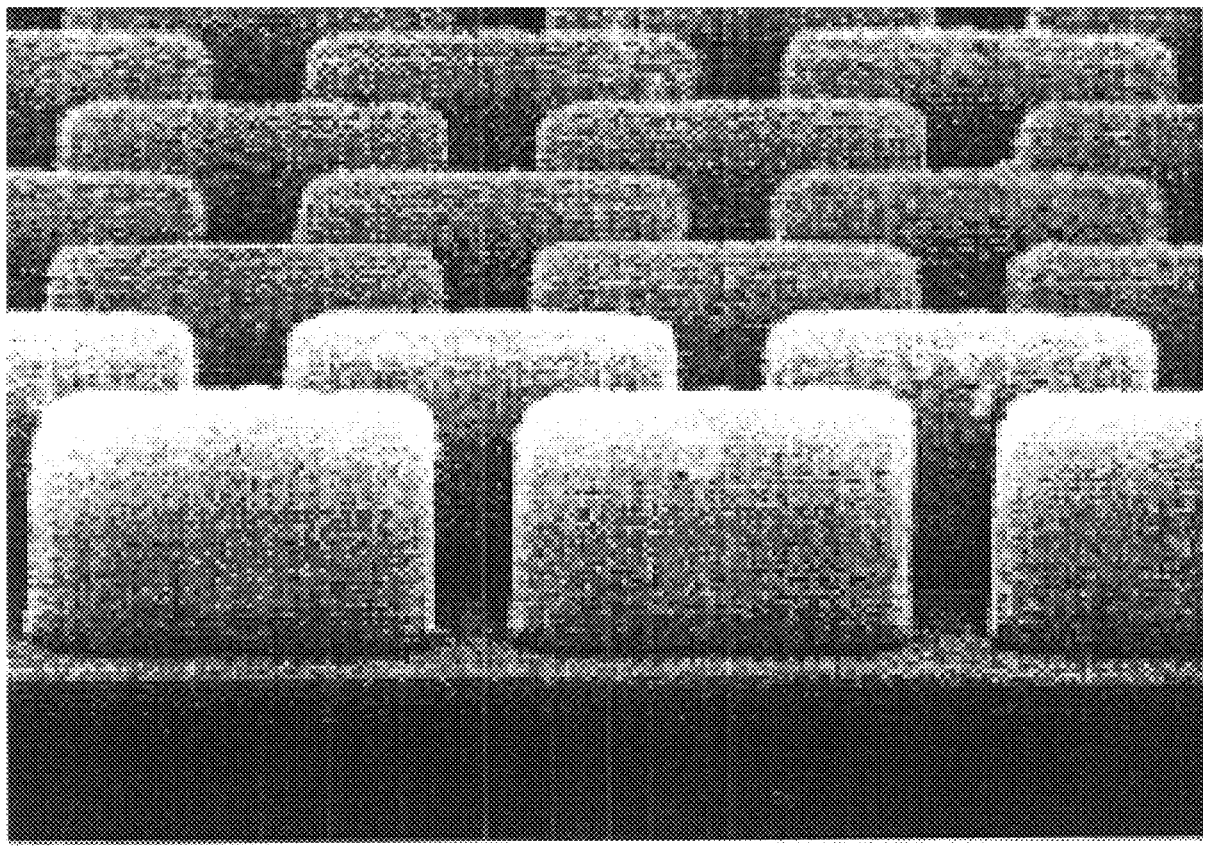
FIG. 15 is a lateral view of a pattern formed by the present invention.
Figure 16:
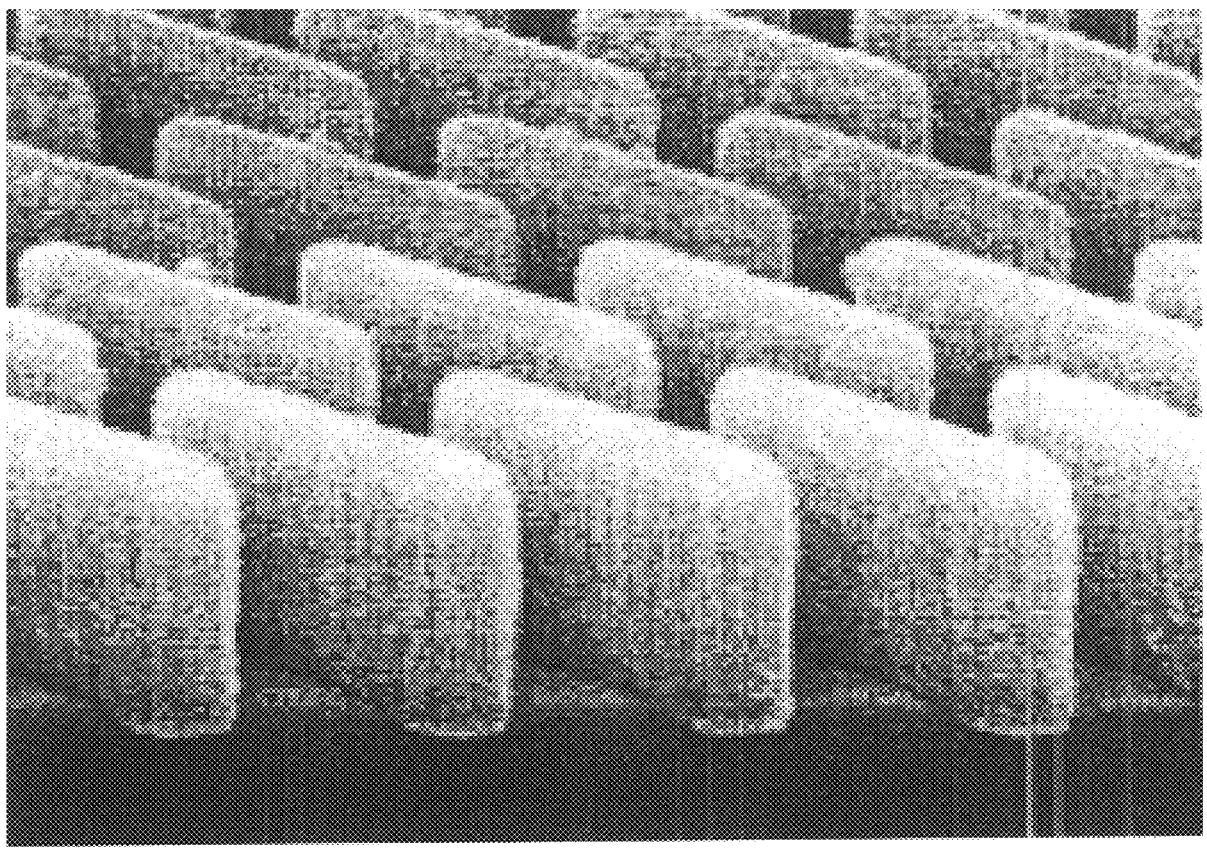
FIG. 16 is a perspective view of a pattern formed by the present invention.

Thereafter, if the etched layer 32 being exposed by using the photosensitive film 34's pattern as a mask is etched until the semiconductor substrate 30 are exposed, a fine pattern fabrication process of forming a pattern of the etched layer 32 is completed as shown in FIG. 12.

As described above, the method for forming a fine pattern in a semiconductor device according to the present invention removes roughness from a pattern produced in a fine pattern fabrication process using a silylation process as being one kind of a TSI process, eliminates smoothly a photosensitive film residue caused by a silylation region remained on a non-pattern area, and etches a predetermined thickness of the photosensitive film surface with a mixed gas of fluorine/oxygen after the silylation process in order to increase a margin of a lithography process. During the etching step of the photosensitive film, the method according to the present invention enables the edge portion of the silylation region to be planarized so as to prevent the pattern from becoming rough. After a pattern is formed by the oxygen plasma, the present invention removes again the photosensitive film residue left on the non-pattern area by using the mixed gas of fluorine/oxygen, thereby increasing a fabrication margin of the fine pattern.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for forming a fine pattern in a semiconductor device, comprising the steps of:
   (a) providing a semiconductor substrate;
   (b) sequentially forming an etched layer and a photosensitive film for silylation on the semiconductor substrate;
   (c) selectively exposing the photosensitive film by using a light-exposure mask;
   (d) selectively forming a silylation region by performing a silylation on the surface of the photosensitive film;
   (e) partially etching the surface of the photosensitive film with a fluorine-based gas or a mixed gas of fluorine/oxygen, and removing a silylated portion on a portion determined as a non-pattern area during the silylation process in order to prevent an irregular breaking of a silylation region edge portion;
   (f) etching a photosensitive film of the non-pattern area with oxygen plasma using the silylation region of a light-exposure area as an etching boundary to form a photosensitive film pattern;
   (g) etching a photosensitive film residue left on the photosensitive film pattern using a fluorine-based gas or a mixed gas of fluorine/oxygen; and
   (h) etching the etched layer using the photosensitive film pattern as a mask to form a pattern of the etched layer.

2. A method for forming a fine pattern in a semiconductor device as set forth in claim 1, wherein the photosensitive film is formed at a thickness of 5000 to 15000 Å.

3. A method for forming a fine pattern in a semiconductor device as set forth in claim 1, wherein the photosensitive film is presilylation-baked at a temperature of 100 to 200° C. using helium (He) gas or $N_2$ gas before the silylation step.

4. A method for forming a fine pattern in a semiconductor device as set forth in claim 1, wherein:
   a silylation material used in the silylation step is a selected one or a mixture of at least two components which are the following among hexamethyldisilazane (HMDS), tetramethyldisilazane (TMDS), dimethylaminodimethylsilane, dimethylaminoethylsilane, dimethylsilydimethylamine, trimethylsilydimethylamine, trimethylsilydiethylamine, and dimethylaminopentamethylsilane.

5. A method for forming a fine pattern in a semiconductor device as set forth in claim 1, wherein the silylation step is performed at a temperature of 90 to 180° C. for 30 to 300 seconds.

6. A method for forming a fine pattern in a semiconductor device as set forth in claim 1, wherein the step (e) is performed under fabrication conditions, i.e., a temperature of −10 to 30° C., a pressure of 1 to 50 mTorr, a top power of 10 to 300 W, a bottom power of 0 to 100 W, fluorine-based gas of 1 to 10 sccm, and oxygen gas of 0 to 30 sccm.

7. A method for forming a fine pattern in a semiconductor device as set forth in claim 6, wherein the fluorine-based gas of the step (e) is one among $C_2F_6$, $CF_4$, and $C_4F_8$ gases.

8. A method for forming a fine pattern in a semiconductor device as set forth in claim 1, wherein the step (f) is performed with $O_2$ or a mixed gas of $O_2/He_2/SO_2$ under fabrication conditions, i.e., a temperature of −10 to 30° C. and a pressure of 1 to 50 mTorr.

9. A method for forming a fine pattern in a semiconductor device as set forth in claim 1, wherein the step (g) is performed under fabrication conditions, i.e., a top power of 10 to 300 W, a bottom power of 0 to 100 W, fluorine-based gas of 1 to 10 sccm, oxygen gas of 0 to 30 sccm, a temperature of −10 to 30° C., and a pressure of 1 to 50 mTorr.

10. A method for forming a fine pattern in a semiconductor device as set forth in claim 1, wherein one fluorine-based gas of the step (g) is among $C_2F_6$, $CF_4$, and $C_4F_8$ gases.

* * * * *